(12) United States Patent
Allred

(10) Patent No.: US 6,965,676 B1
(45) Date of Patent: Nov. 15, 2005

(54) VOLUME-RESPONSIVE LOUDNESS COMPENSATION CIRCUITS, SYSTEMS, AND METHODS

(75) Inventor: Rustin W Allred, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 1187 days.

(21) Appl. No.: 09/603,950

(22) Filed: Jun. 27, 2000

Related U.S. Application Data

(63) Continuation-in-part of application No. 09/421,417, filed on Oct. 19, 1999.

(51) Int. Cl.[7] .............................................. H03G 3/00
(52) U.S. Cl. ........................ 381/104; 361/107; 361/109
(58) Field of Search ................................ 381/107, 109, 381/104, 102, 105, 108

(56) References Cited

U.S. PATENT DOCUMENTS

| | | | |
|---|---|---|---|
| 4,490,843 A | 12/1984 | Bose et al. | 381/102 |
| 4,739,514 A | 4/1988 | Short et al. | 381/103 |
| 5,046,107 A * | 9/1991 | Iwamatsu | 381/107 |
| 5,208,866 A * | 5/1993 | Kato et al. | 381/107 |
| 5,381,381 A | 1/1995 | Sartori et al. | 381/24 |
| 5,396,562 A * | 3/1995 | Ishimitsu et al. | 381/107 |
| 5,524,060 A * | 6/1996 | Silfvast et al. | 381/104 |
| 5,784,476 A * | 7/1998 | Bird | 381/107 |
| 5,890,126 A * | 3/1999 | Lindemann | 704/503 |
| 5,907,622 A * | 5/1999 | Dougherty | 381/57 |
| 6,678,382 B2 * | 1/2004 | Peterson | 381/104 |
| 2002/0076072 A1 * | 6/2002 | Cornelisse | 381/312 |

OTHER PUBLICATIONS

Fletcher, G H and Munson, W A, *Loudness, Its Definition, Measurement, and Calculation*, Jouirnal of the Acoustical Society of America, vol. 5, Oct. 1933.

Holman, T and Kampmann, F, *Loudness Compensation: Use and Abuse*, Journal ot the Audio Engineering Society, vol. 26, No. 7/8, Jul./Aug. 1978.

Newcomb, A L, and Young R N, *Practical Loudness: An Active Circuit Design Approach*, Journal of the Audio Engineering Scoiety, vol. 24, No. 1, Jan./Feb. 1976.

Neoran, I and Shashua, M. *A Perceptive Loudness-Sensitive Leveler for Audio Broadcasting and Mastering*, Preprint 4852; 105th Convention of the Audio Engineering Society, Sep. 1998.

Stevens, S S; *Perceived Level of Noise by Mark VII and Decibels (E)*, Journal of the Acoustical Society of America, vol. 51, pp. 575-601, 1972.

* cited by examiner

*Primary Examiner*—Xu Mei
*Assistant Examiner*—Corey Chau
(74) *Attorney, Agent, or Firm*—J. Dennis Moore; W. James Brady, III; Frederick J. Telecky, Jr.

(57) ABSTRACT

An audio compensation system (20) for producing a sound compensated output signal ($S_o$). The system comprises a volume control circuit (24) for producing a volume-adjusted signal ($S_{ic}$) by applying a volume adjustment to an audio signal in response to a volume setting, wherein the sound compensated output signal is responsive to the volume-adjusted signal. The system also comprises circuitry (26, 30, 32) for producing an amplified signal ($S_{ifa}$) by amplifying a selected bandwith of signals in response to the volume setting. The sound compensated output signal is also responsive to the amplified signal.

3 Claims, 1 Drawing Sheet

VOLUME-RESPONSIVE LOUDNESS COMPENSATION CIRCUITS, SYSTEMS, AND METHODS

CROSS-REFERENCES TO RELATED APPLICATIONS

This application is a continuation-in-part application of U.S. patent application Ser. No. 09/421,417, filed Oct. 19, 1999, entitled "Configurable Digital Loudness Compensation System And Method," having the same inventor as the present application, and incorporated herein by this reference.

STATEMENT REGARDING FEDERALLY SPONSORED RESEARCH OR DEVELOPMENT

Not Applicable.

BACKGROUND OF THE INVENTION

The present embodiments relate to digital sound processing, and are more particularly directed to digital loudness compensation.

For decades it has been understood that the human listener's perception of loudness varies with frequency when sound pressure (i.e., volume) is held constant. Specifically, for a fixed sound pressure, bass frequencies are perceived at a lower loudness than are treble frequencies. As a result, various sound processing approaches have arisen to process pre-recorded sound so that it is played back in a modified manner.

One sound processing approach in the art amplifies relatively low audible frequency signals to a greater volume, thereby providing a human with the perception that all frequencies are being heard at a like sound pressure. This approach has been referred to in the art as "loudness compensation." Loudness compensation is typically performed with reference to various loudness versus frequency curves that have been created by persons skilled in the art and that present what the creator of the curves believes is an ideal modification to the sound based on the frequency of the sound. Such curves, for example, have been provided in works by S. S. Stevens, who attempted to improve upon the so-called Fletcher-Munson curves produced by G. H. Fletcher and W. A. Munson.

Another sound processing approach in the art is based on the difference between the sound level at the time the sound was recorded versus the sound level at which the sound is played back. Thus, this approach focuses not on the difference in sound frequency but instead on the difference between the recording and playback volumes, and this approach is sometimes referred to in the art as "differential loudness compensation." Differential loudness compensation also consults various curves, where by way of example a set of such curves are shown in FIG. 1. In the example of FIG. 1, a sound recording is made at 85 dB, and eight plots $10_1$ through $10_8$ are shown corresponding to gain adjustments that are recommended to be made to the sound when presented at playback levels different than 85 dB. More particularly, plot $10_1$ corresponds to the gain adjustments to be made for a playback at 45 dB, plot $10_2$ corresponds to the gain adjustments to be made for a playback at 50 dB, and so forth for the remaining plots at 5 dB increments up to plot $10_8$ which corresponds to the gain adjustments to be made for a playback at 75 dB. A similar set of curves may be generated for different recording sound pressure levels. However, both the gains and the shapes of the curves may vary somewhat for the various recording levels. In any event, differential loudness compensation has particular application where music has been played and recorded live, and there is a desire for a person listening to a subsequent playback of the recording (at a different volume) to experience the music as if the person were attending the original live performance.

The actual circuit implementations of the sound compensation methodologies described above also have varied in the art based on various criteria, and many of these implementations have limitations. For example, there is often the question of whether an implementation should be directed to loudness compensation or differential loudness compensation. As another example, there often are considerations of the physical limitations, complexity, and costs of audio systems and compensation systems. As still another example, often there is correction only at very low audible frequencies, such as through the use of a bandpass filter centered at those frequencies. However, such an approach may not be workable in a relatively inexpensive audio system that has poor (or no) response at such low frequencies. As a result, some of the prior approaches may be implemented at slightly higher frequencies, but in these alternatives there is the possibility that higher frequency signals, such as vocal frequencies, may be modified in a manner that is undesirable or inconsistent with the human ear's original failure to accurately perceive the lower frequencies. As yet another example, considerations arise regarding the media to be reproduced as well as listener preferences. As still another example, differential loudness compensation may not be feasible or may be difficult for some types of pre-recorded sounds because typically the sound pressure of the level of the sound at the time of recording is not directly encoded or otherwise provided along with the recording, where instead there typically is only some electrical, mechanical, or numerical representation of the sound itself.

By way of further background, U.S. Pat. No. 4,739,514 ("the '514 patent") issued on Apr. 19, 1988 to Short et al., is entitled "Automatic Dynamic Equalizing," and is hereby incorporated herein by reference. The '514 patent illustrates in its FIG. 1 a sound processing circuit where an audio input signal (11), previously having been adjusted by a volume control, is coupled both to a signal combiner (14) and a compressor (15). The compressor adjusts the gain of the audio input signal in response to the energy of that signal. More particularly, the compressor performs what is urged as a 2:1 compression ratio based on the energy of the audio signal so that for every increase in 2 dB of the audio input signal, the gain is decreased by 1 dB. Further, the gain-adjusted signal is then passed through a bandpass filter (16) centered about a relatively low frequency on the order of 55–70 Hz. The resulting signals are shown in FIG. 2 of the '514 patent, from which one skilled in the art will appreciate that the amplified and filtered signals are centered between 50 and 60 Hz, and a lesser gain is applied by the compressor in response to ascending levels of input energy.

While the '514 patent as well as other approaches in the art may provide acceptable sound processing in some circumstances, the present inventor has recognized various additional drawbacks in such approaches when implemented in certain systems. For example, the approach of the '514 patent explicitly avoids the use of a volume control as a contributor to its equalization approach, while as shown later the present inventor has found the use of a volume control in a loudness compensation circuit to be beneficial, particularly in a digital implementation. As another example, the '514 patent focuses primarily on a compression ratio of 2:1 (although it suggests that such a ratio need not be restricted thereto), where such a restriction may not provide adequate flexibility given various system considerations or user preferences. As a final example, the previous approaches are often relatively complex or sacrifice quality and/or the ability to configure the sound processing methodology, where such aspects are likely highly desirable in certain sound reproduction systems.

In view of the above, there arises a need to address the drawbacks of the prior art sound compensation systems, and this need is explored in connection with the preferred embodiments described below.

BRIEF SUMMARY OF THE INVENTION

In the preferred embodiment, there is an audio compensation system for producing a sound compensated output signal. The system comprises a volume control circuit for producing a volume-adjusted signal by applying a volume adjustment to an audio signal in response to a volume setting, wherein the sound compensated output signal is responsive to the volume-adjusted signal. The system also comprises circuitry for producing an amplified signal by amplifying a selected bandwith of signals in response to the volume setting. The sound compensated output signal is also responsive to the amplified signal. Other circuits, systems, and methods are also disclosed and claimed.

DETAILED DESCRIPTION OF THE INVENTION

Figure 1:
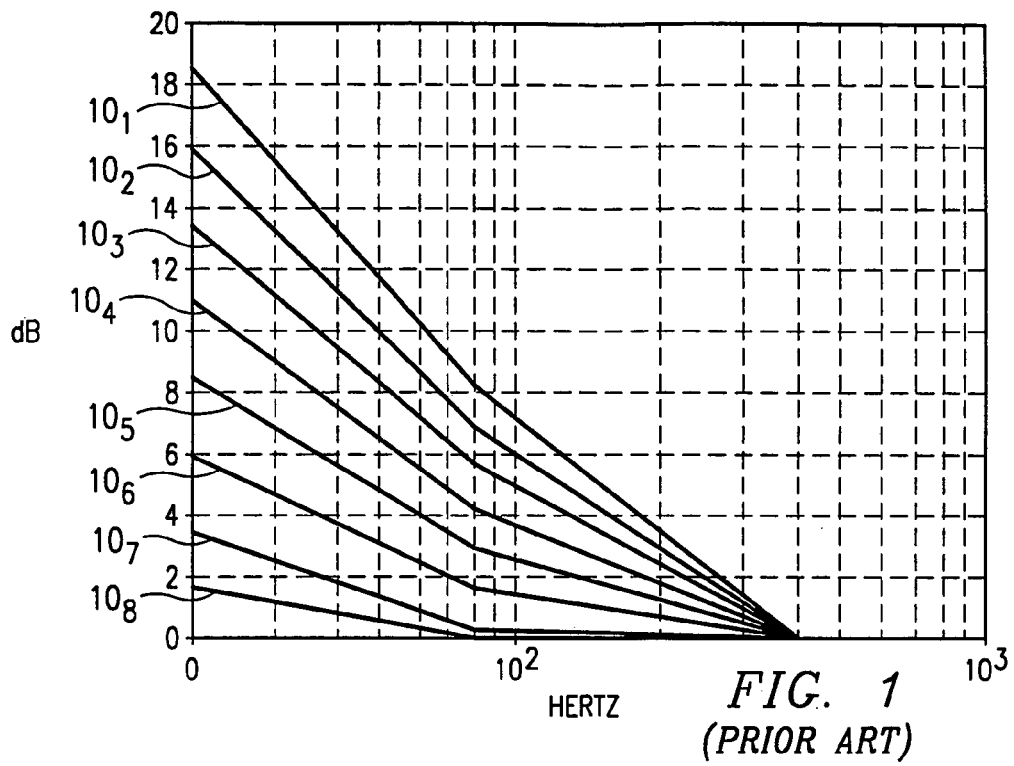
FIG. 1 illustrates a set of differential loudness compensation curves according to the prior art.

FIG. 1 was discussed above in the Background Of The Invention section of this document and the reader is assumed familiar with the details of that discussion.

Figure 2:
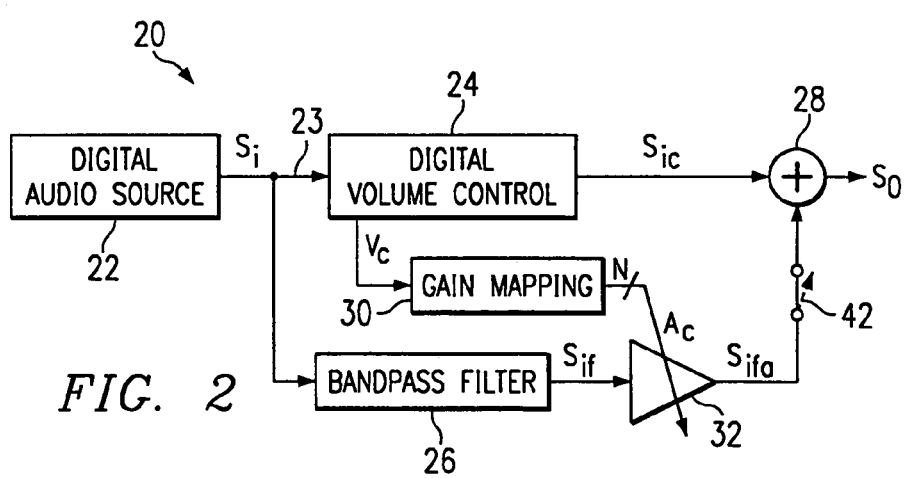
FIG. 2 illustrates a block diagram of a differential loudness compensation circuit according to the preferred embodiment.

FIG. 2 illustrates a block diagram of a differential loudness compensation circuit 20 according to the preferred embodiment. By way of introduction, a few observations are made. As a first observation, the blocks of FIG. 2 are by way of example to discuss the functionality and method of operation of circuit 20. Thus, the blocks of FIG. 2 may be combined or further subdivided by one skilled in the art unless stated to the contrary in this document. In addition, the blocks of FIG. 2 may be implemented by one skilled in the art using various different circuits or via a dedicated integral device or a signal processor. As a second observation, only a single channel is shown in FIG. 2 to simplify the illustration and following discussion, while one skilled in the art will appreciate that the inventive teachings of this document may be applied to a multiple channel system.

Turning to the blocks of differential loudness compensation circuit 20, a digital audio source 22 is shown and presents a digital audio signal $S_i$ at a node 23. Digital audio source 22 may take many forms, and may be chosen based on the fact that the signal $S_i$ may be derived from various forms of recorded or live sound sources. As examples of recorded sound sources, they may include CD-ROM, DVD, digital audio tape, or still others. Digital audio source 22 also may include a signal converted into digital form but that was earlier presented or stored in an analog form. In any event, signal $S_i$ at node 23 is connected along a first path of circuit 20 to the input of a digital volume control 24 and along a second parallel path to the input of a bandpass filter 26. Each of these paths and the devices in those paths is discussed below.

Digital volume control 24, along the first path of loudness compensation circuit 20, represents any type of circuit where a volume-based change may be made to an audio signal in response to a setting of a volume control, and preferably where the circuit provides a digital volume control value, shown in FIG. 2 as $V_c$, which represents the setting of the volume control. Thus, digital volume control 24 may directly represent a user-tunable device or a digital device that operates in response to user-adjustable device. In a fully digital implementation as is preferred, digital volume control 24 does not include an analog potentiometer that may wear out or introduce excessive noise or interference into the signal processing. In such an implementation, by way of example, $V_c$ may be set in response to a user pushing buttons such as an up or down button, where each button push corresponds to a respective increase or decrease in the digital value $V_c$. As an alternative, $V_c$ may be set in response to some other input device or in response to an electrical input signal such as may be provided by other circuitry related to or in communication with differential loudness compensation circuit 20. In any event, the level of volume control $V_c$ is imposed on the input signal $S_i$, and a resulting output signal $S_{ic}$ is produced by digital volume control 24. Output signal $S_{ic}$ is connected to a first input of a signal combiner 28. In the preferred embodiment, signal combiner 28 is a digital adder. Lastly, the value $V_c$ from digital volume control 24 is also connected to an input of a gain mapping circuit 30. As further detailed below, gain mapping circuit 30 provides an amplifier control signal, $A_c$, in response to the value $V_c$.

Turning now to the second path of differential loudness compensation circuit 20, recall that signal $S_i$ is connected to the input of bandpass filter 26. In one preferred embodiment, both the center frequency and the bandwidth of bandpass filter 26 may be fixed by one skilled in the art such as by consulting loudness compensation curves and where the fixed frequency may be in the range of approximately 10 to 200 Hz and the bandwidth may be on the order of 10 to 300 Hz. In an alternative embodiment, however, either or both the center frequency and bandwidth of bandpass filter 26 may be adjustable, such as in response to input signals to the filter for these values. Indeed, in this alternative embodiment, bandpass filter 26 is preferably a general second-order infinite impulse response filter and allows a user or other source to provide coefficients to provide various filtering effects as dictated by those coefficients. In any event, bandpass filter 26 outputs a portion of the frequency spectrum of the input signal $S_i$ and, for sake of reference, this output signal is shown as signal $S_{if}$.

Signal $S_{if}$ from bandpass filter 26 is connected to an input of an amplifier circuit 32. In the preferred embodiment, amplifier circuit 32 is an adjustable-gain amplifier and may be constructed using various circuits ascertainable by one skilled in the art. For any of these various circuit implementations, the gain of amplifier circuit 32 is connected to be adjustable in response to the amplifier control signal, $A_c$, provided by the output of gain mapping circuit 30. Further, in the preferred embodiment as a fully digital circuit, $A_c$, is a digital value as is the output of bandpass filter 26 and, thus, $A_c$ is shown as a multiple bit (e.g., N-bit) signal. Given these two digital values, amplifier circuit 32 may be implemented as a multiplier of $A_c$ with the output of bandpass filter 26. In any event, it may be said that in response to the N-bit signal $A_c$, amplifier circuit 32 amplifies its input signal $S_{if}$ and produces a corresponding amplified output signal shown for sake of reference as signal $S_{ifa}$. Signal $S_{ifa}$ is connected to a second input of signal combiner 28. Finally, the output signal of signal combiner 28 is shown as signal, $S_o$, and presents a signal that has been compensated for differential loudness as will be further appreciated from the operational description later; thus, signal $S_o$ may be applied to a speaker or the like, or it may be further used or processed as is ascertainable by one skilled in the art.

The operation of differential loudness compensation circuit 20 is now described in connection with FIG. 2, with further details and alternatives also provided later. Digital audio source 22 provides signal $S_i$ in response to either a real-time or pre-recorded audio signal. In the first path of circuit 20, signal $S_i$ is adjusted according to the setting of digital volume control 24 with the resulting adjusted signal, $S_{ic}$, thereby connected to signal combiner 28. In the second path of circuit 20, a bass-region filtered portion of signal $S_i$, namely, $S_{if}$, is provided to amplifier circuit 32 and is amplified according to the N-bit signal $A_c$. One preferred manner of developing the signal $A_c$ by gain mapping circuit 30 in response to $V_c$ is described later, and other translations or conversions between the value of $V_c$ and the corresponding output value of $A_c$ may be selected by one skilled in the art. In any event, the amount of amplification indicated by the value $A_c$ is imposed on signal $S_{if}$ input to amplifier circuit 32, and the corresponding amplified output signal $S_{ifa}$ is then provided to signal combiner 28, where it is combined with the signal $S_{ic}$ from the first path in circuit 20. Finally, therefore, signal combiner 28 provides its output (i.e., $S_{ic}+S_{ifa}$) as signal $S_c$.

Figure 3:
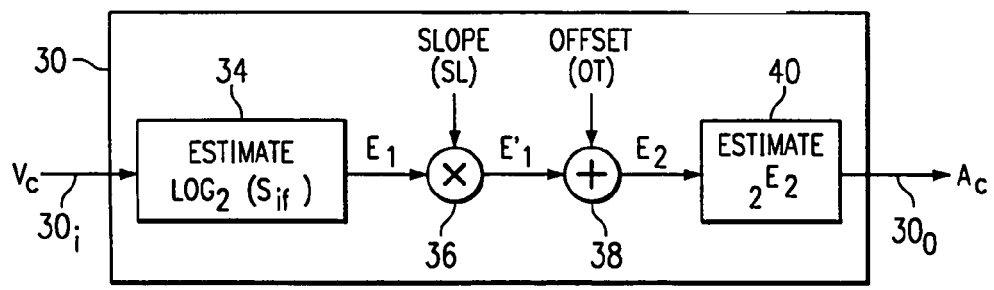
FIG. 3 illustrates a block diagram of the gain mapping circuit from FIG. 2 in greater detail.

FIG. 3 illustrates a block diagram of a preferred embodiment for gain mapping circuit 30 from FIG. 2. The signal $V_c$ from volume control circuit 24 is connected to an input $30_1$ of gain mapping circuit 30, and input $30_i$ is connected to the input of a logarithm circuit 34. In the preferred embodiment, logarithm estimate circuit 34 estimates the base 2 logarithm of its input, where this estimate is provided as signal $E_1$ at the output of circuit 34. Thus, $E_1$ may be represented by the following Equation 1:

$$E_1 = \log_2(V_c) \quad \text{Equation 1}$$

Signal $E_1$ is connected as a multplier value to a first input of a mulitplier 36, while the second input of multiplier 36 receives a multplier value that is a slope value, SL. In the preferred embodiment, slope value SL may be a fixed value or may be dynamically provided in response to either a user input or some other designed circuit, where design considerations for the value of SL will be apparent given the remaining discussion of gain mapping circuit 30. The product output of mulitplier 36 is the product shown in FIG. 3 as $E_1'$ and may be represented by the following Equation 2:

$$E_1' = SL*E_1 \quad \text{Equation 2}$$

$E_1'$ is connected as an addend to a first input of a summer 38, while the second input of summer 38 receives an addend that is an offset value, OT. Like the value SL, the value OT also may be a fixed value or may be dynamically provided in response to either a user input or some other designed circuit. The output of summer 38 is shown as $E_2$ and may be represented by the following Equation 3:

$$E_2 = E_1' + OT \quad \text{Equation 3}$$

$E_2$ is connected to an input of an inverse logarithm circuit 40. In the preferred embodiment, inverse logarithm estimate circuit 40 estimates the base 2 inverse logarithm of its input, where this estimate is the output signal $A_c$ provided to an output 30 for gain mapping circuit 32. Thus, $A_c$ may be represented by the following Equation 4:

$$A_c = 2^{E_2} \quad \text{Equation 4}$$

Lastly, note that logarithm circuit 34 and inverse logarithm circuit 40 may be implemented in various fashions, but one particularly preferred approach is illustrated in U.S. patent application Ser. No. 09/192,981, entitled "Digital Signal Processing Circuits, Systems, And Methods Implementing Approximations For Logarithm And Inverse Logarithm," filed Nov. 16, 1998, and hereby incorporated herein by reference.

The operation of gain mapping circuit 30 is now described in greater detail, with reference to both FIG. 3 and FIG. 2. Volume control circuit 24 provides the volume control signal $V_c$ to gain mapping circuit 30 and, more particularly, to logarithm estimate circuit 34. In response, logarithm estimate circuit 34 provides the value $E_1$ as shown in Equation 1, above. Next, $E_1$ is processed through multiplier 36 (to produce $E_1'$) and summer 38, with the result being $E_2$. The relationship between $E_2$ and $E_1$ may be appreciated further by substituting Equation 2 into Equation 3 to create the following Equation 5:

$$E_2 = (SL*E_1) + OT \quad \text{Equation 5}$$

Equation 5 demonstrates that the relationship between $E_2$ and $E_1$ is a linear relationship, that is, it takes the form of the familiar linear expression of y=mx+b, where m is a slope and b is an offset. In the present case, therefore, the slope is the value SL and the offset is the value OT. Thus, $E_2$ may be shaped in any linear fashion with respect to $E_1$ and in terms of the values SL and OT. As a result, note that a linear modification may be made to signal $E_1$ to accomplish the change suggested by a differential loudness curve or, indeed, according to other curves or desirable sound modification techniques. From this observation, it now should be appreciated how the values of SL and OT may be designed, either fixed or dynamically alterable, to achieve a desired level of sound compensation given the configuration of differential loudness compensation circuit 20. Finally, an inverse logarithm circuit 40 provides the output signal $A_c$ as the base 2 inverse logarithm of its input $E_2$.

The operation of gain mapping circuit 30 also may be appreciated further via a numeric example. In addition, a numeric example of the operation of gain mapping circuit 30 demonstrates how circuit 30 may in some instances accomplish a compensation result comparable to that of the '514 patent described above in the Background Of The Invention section of this document. Specifically, recall that the '514 patent illustrates a 2:1 compressor; one skilled in the art may ascertain that such a compression results in effect in the square root being taken of the filtered signal. By comparison, the preferred embodiment for gain mapping circuit 30 may, in combination with bandpass filter 26 and amplifier circuit 32, achieve a comparable result, but in a different way, if the slope value SL is set to one-half and the offset value OT is set to zero, thereby causing the output signal $A_c$ to be the square root of the input signal $V_c$. As an arbitrary numeric example of this effect, assume that $V_c$ equals 4.

According to Equation 1 and the operation of logarithm circuit 34, then $E_1$ equals 2 (i.e., $E_1=\log_2(4)=2$), and according to Equation 2, then $E_1'$ equals 1 (i.e., $E_1'=\frac{1}{2}*2=1$). Next, since OT equals zero then no offset is added to $E_1'$ and, thus, the same value of 1 is applied as $E_2$ to inverse logarithm circuit 40. Finally, according to Equation 4 and the operation of inverse logarithm circuit 40, the output of amplifier circuit 32, $A_c$, equals 2 (i.e., $A_c=2^1=2$). Thus, for this example, $A_c$ (i.e., 2) has been shown to be the square root of $V_c$ (i.e., 4).

Additional numeric examples of the operation of amplifier circuit 32 also may be ascertained by one skilled in the art. Indeed, the example of the preceding paragraph may be modified by adding an offset value, OT, thereto. In the case of a positive offset OT, and leaving the slope value SL equal to ½, it may be readily confirmed that the output $A_c$ will be larger than the square root of the input $V_c$. Further, still other examples using different slope values and different offsets also may be explored. Thus, these many examples demonstrate various advantages of the preferred embodiment. For example, the preferred embodiment offers considerably more gain mapping flexibility than the approach of the '514 patent. As another example, the slope and offset values may be dynamically changed during the operation of differential loudness compensation circuit 20 and, thus, the mapping can be readily changed for different circumstances. As still another example, system designers may offer end users a wide range of adjustability for their personal preferences.

Another alternative embodiment is contemplated within the present inventive scope with respect to digital volume control 24 and which is better presented now given the understanding of the operation of differential loudness compensation circuit 20. Specifically, digital volume control 24 preferably includes sufficient circuitry so as to soften any change of the volume setting. In other words, if a sudden and relatively large change is made to the volume setting of control 24, the softening circuitry smoothes this change as it is reflected by $V_c$ and, thus, the softening also improves changes that otherwise would appear in signal $A_c$ as well as on the change from signal $S_i$ to signal $S_{ic}$. This additional aspect will reduce or eliminate the effects that a sharp transition in $V_c$ could otherwise present in the output signal $S_o$, such as audible static, popping, or other noise artifacts. Further, by way of example of a digitally softened volume control, the reader is referred to U.S. patent application Ser. No. 09/232,304, entitled "Soft Gain Update Method And Apparatus," filed Jan. 15, 1999, which claims priority from U.S. patent application 60/071,564, filed Jan. 15, 1998, both of which applications are hereby incorporated herein by reference.

As still another alternative embodiment, attention is once more returned to FIG. 2, and it is now noted that a switch 42 is shown in phantom and connected between the output of amplifier circuit 32 and the second input of signal combiner 28. Switch 42 is intended as a logical illustration that in the preferred embodiment the loudness compensation function provided in differential loudness compensation circuit 20 may be selectively disabled (i.e., logically, by opening switch 42), in which case no amplification is provided from the second path of circuit 20. In actual implementation, this disabling capability may be performed by breaking the path as shown, or by other techniques such as disabling amplifier circuit 32 or temporarily providing a zero value amplifier control signal, $A_c$, to amplifier circuit 32. In any event, when the second path is disabled, no additional gain is thereby provided to signal $S_o$, although certainly other circuitry could be used in connection with differential loudness compensation circuit 20 to provide some other type of gain (e.g., a manual gain).

From the above, it may be appreciated that the above embodiments provide sound compensation and may do so using an efficient architecture having considerable flexibility. Further, the preferred embodiments provide an efficient balance between device complexity and cost, while also allowing a desirable capacity for sound loudness compensation. Further, these capabilities are achieved without the additional complexity required in an approach, such as that of the '514 patent, that is otherwise required to separately evaluate the energy in a sound signal and then filter and/or amplify the signal in response to that energy determination. In addition, while the present embodiments have been described in detail, one skilled in the art should note that various substitutions, modifications or alterations could be made to the descriptions set forth above without departing from the inventive scope. Indeed, various examples have been presented above, and still others also exist. For example, while it is mentioned earlier that the inventive teachings of this document may be applied to a multiple channel system, note further that such an implementation may take alternative forms, such as one gain mapping circuit for all such channels or an individual gain mapping circuit for each such channel. As another example, various alternative filters may be contemplated for bandpass filter 26. As still another example, while differential loudness compensation circuit 20 is preferably implemented using a fully digital circuitry and digital sound processing, some tradeoffs may be obtained while still achieving sufficient compensation if various analog devices are included therein. As another example, it is noted that the two parallel paths of differential loudness compensation circuit 20 are preferred in various respects as they readily lend themselves to flexibility in implementation. For example, parallel paths may simplify the implementation of the circuit in hardware, particularly to avoid matters like limit cycles that may otherwise add noise into the operation of the circuit. As another example, the parallel path may simplify the considerations required for developing the coefficients for bandpass filter 26. Notwithstanding the benefits of the parallel path configuration, alternatives embodiments may be created wherein the gain mapping and filtering functions are incorporated into a single path receiving signal $S_i$ and producing a loudness compensated resulting signal. As a final example, while the preferred embodiment includes digital volume control 24 within the first path, in an alternative embodiment it could be removed from the first path while its setting is still used as a basis for determining the amount of gain to be applied by amplifier circuit 32. Thus, these many additional examples serve to further illustrate the inventive scope, as is defined by the following claims.

What is claimed is:

1. An audio compensation system for producing a sound compensated output signal, comprising:
    a volume control circuit for producing a volume-adjusted signal by applying a volume adjustment to an audio signal in response to a volume setting, wherein the sound compensated output signal is responsive to the volume-adjusted signal; and
    circuitry for producing an amplified signal by amplifying a selected bandwith of signals in response to the volume setting, wherein the sound compensated output signal is also responsive to the amplified signal, wherein the circuitry for producing an amplified signal comprises:

a logarithm estimating circuit for receiving a value in response to the volume setting and outputting a first estimated signal;

circuitry for modifying the first estimated signal to form a modified signal; and an inverse logarithm estimating circuit for receiving the modified signal and outputting a second estimated signal, wherein:

the sound compensation output signal is responsive to the second estimated signal, wherein the logarithm estimating circuit is a base 2 logarithm estimating circuit;

the inverse logarithm estimating circuit is a base 2 inverse logarithm estimating circuit, wherein the circuitry for modifying the first estimated signal comprises circuitry for modifying the first estimated signal according to a linear modification; and the linear modification is in response to an adjustable slope value and an adjustable offset value.

2. An audio compensation system for producing a sound compensated output signal, comprising:

a volume control circuit for producing a volume-adjusted signal by applying a volume adjustment to an audio signal in response to a volume setting, wherein the sound compensated output signal is responsive to the volume-adjusted signal; and circuitry for producing an amplified signal by amplifying a selected bandwith of signals in response to the volume setting, wherein the sound compensated output signal is also responsive to the amplified signal, wherein the circuitry for producing an amplified signal comprises:

a logarithm estimating circuit for receiving a value in response to the volume setting and outputting a first estimated signal;

circuitry for modifying the first estimated signal to form a modified signal; and an inverse logarithm estimating circuit for receiving the modified signal and outputting a second estimated signal, wherein:

the sound compensation output signal is responsive to the second estimated signal, the circuitry for modifying the first estimated signal comprises circuitry for modifying the first estimated signal according to a linear modification, and the linear modification is in response to an adjustable slope value and an adjustable offset value.

3. A method of operating an audio compensation system to produce a sound compensated output signal, comprising the steps of:

applying a volume adjustment to an audio signal in response to a volume setting from, a volume control circuit to produce a volume-adjusted signal, wherein the sound compensated output signal is responsive to the volume-adjusted signal; and producing an amplified signal by amplifying a selected bandwith of signals in response to the volume setting, wherein the sound compensated output signal is also responsive to the amplified signal, wherein the producing step comprises:

receiving a value in response to the volume setting and forming an estimated logarithm signal:

modifying the estimated logarithm signal to form a modified signal; and receiving the modified signal and forming an inverse logarithm estimated signal, wherein:

the sound compensation output signal is responsive to the inverse logarithm estimated signal, the modifying step comprises modifying the estimated logarithm signal according to a linear modification, and the linear modification is in response to an adjustable slope value and an adjustable offset value.

* * * * *